United States Patent [19]

Tanno et al.

[11] 4,160,947

[45] Jul. 10, 1979

[54] APPARATUS AND METHOD FOR ELECTRICALLY TESTING MULTI-CORE CABLE

[75] Inventors: Shogo Tanno, Nishinomiya; Masateru Hirose, Takarazuka, both of Japan

[73] Assignee: Dainichi-Nippon Cables, Ltd., Amagasaki, Japan

[21] Appl. No.: 845,363

[22] Filed: Oct. 25, 1977

[30] Foreign Application Priority Data

Oct. 26, 1976 [JP] Japan .................. 51-128947

[51] Int. Cl.$^2$ ............... G01R 31/12; G01R 31/02
[52] U.S. Cl. .................................. 324/54; 324/51
[58] Field of Search ............ 324/51, 54, 73 R, 73 AT, 324/66

[56] References Cited

U.S. PATENT DOCUMENTS

| 1,977,703 | 10/1934 | Swartwout ................. 324/54 X |
| 3,287,633 | 11/1966 | Mollo ......................... 324/54 X |
| 3,473,112 | 10/1969 | Andrews ..................... 324/51 |
| 3,988,666 | 10/1976 | Rowland et al. ............. 324/54 |

FOREIGN PATENT DOCUMENTS 2205286  8/1973  Fed. Rep. of Germany ............. 324/51

*Primary Examiner*—Gerard R. Strecker
*Attorney, Agent, or Firm*—W. G. Fasse; D. F. Gould

[57] ABSTRACT

An apparatus for electrically testing a multi-core cable having first and second ends and including a plurality of insulated cores, comprising a rotary disc having a rotative peripheral surface formed of a plurality of notches each slightly larger than the core diameter for picking up a core and an elastic rotary disc having an engageable peripheral surface for transferring said picked up core along a predetermined path of travel, a lid like member provided along the peripheral surfaces of these discs, clamp means for clamping the cores at two positions at the said first end, an electrode vessel containing an electrically conductive fluid for immersing the cores at said first end for collectively rendering the cores conductive, an inlet adjacent these discs for receiving the cores between the clamp positions and urging the cores toward the peripheral surfaces of said rotary disc, a cutter provided adjacent the inlet and above the rotary disc for cutting the cores, whereby the cores are picked up by said notch one by one and transferred along the peripheral surfaces while each of the picked up cores is engaged with the surface of the elastic rotary disc by the lid like member and cut by said cutter, a counter operable in response to a picked up core, a bladed electrode provided along the periphery of the elastic rotary disc for cutting only the insulation of picked up core so as to be in contact with the conductor of the picked up core, a voltage source coupled between the bladed electrode and the electrode vessel, and an electrical circuit for detecting a defective contact state between a picked up core contacting the bladed electrode and the remaining cores contacting the electrode vessel.

25 Claims, 15 Drawing Figures

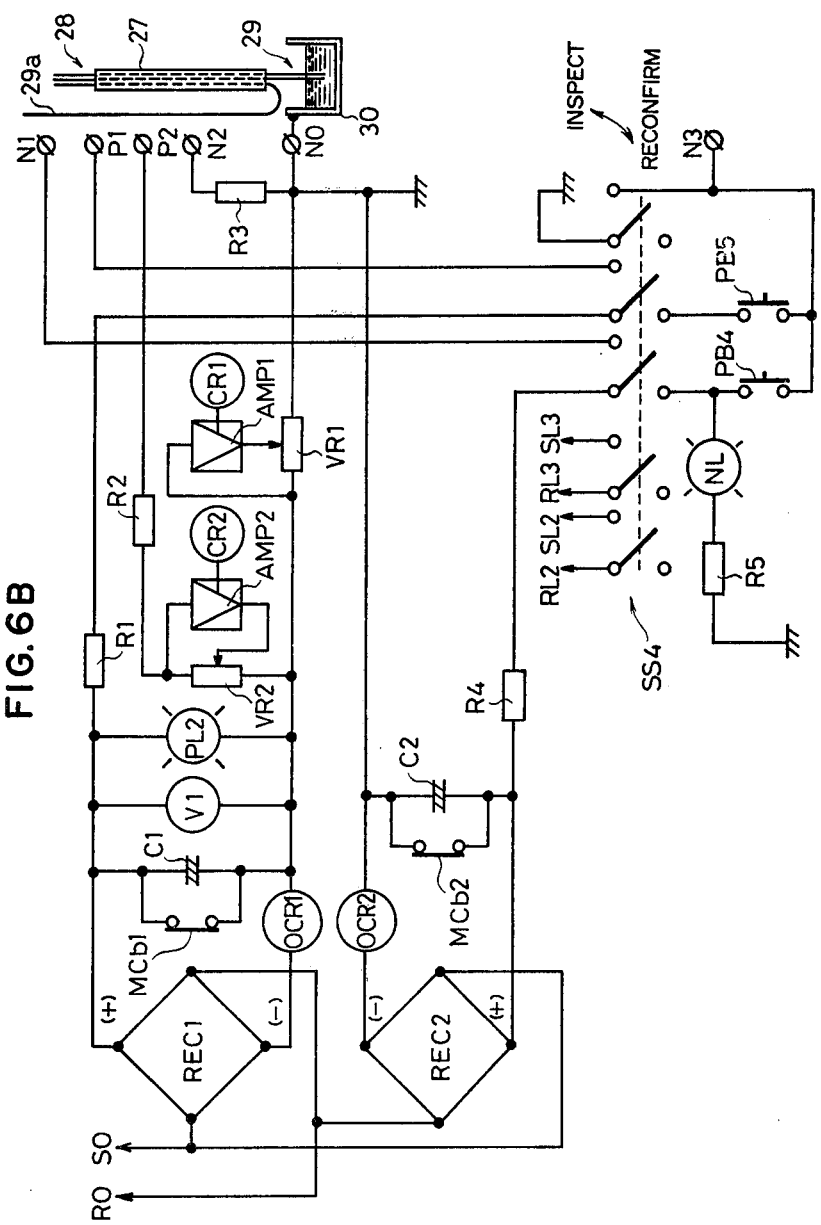

APPARATUS AND METHOD FOR ELECTRICALLY TESTING MULTI-CORE CABLE

BACKGROUND OF THE INVENTION

1. Field of the Invention

This invention relates to a method and apparatus for electrically testing multi-core cables, and more particularly it relates to the defective contact test or withstand-voltage test of the cores of a multi-core cable, such as a communication cable, having a number of cores, each comprising a conductor and a cover for insulating the same, by automatically separating said cores one by one.

2. Description of the Prior Art

Usually, a communication cable is constructed using as a structural unit a pair in which two cores are twisted together or a quad in which four cores are twisted together. Some local communication cables containing a number of cable circuits comprise as many as 2,400 to 3,200 pairs, i.e., 4,800 to 6,400 cores may be contained in a single cable. In the production of such communication cables, the cores have to be tested for defective contact for dielectric breakdown which would take place upon application of a specified voltage, in the intermediate or final stage of cable production in order to guarantee the quality of each cable.

Further, in order to carry out such tests, all the cores have to be stripped of their insulating covers at the both ends of the cable.

However, it would require an enormous amount of time or labor to test the cores by successively selecting and separating a single core from the large group of cores as described above. Therefore, various attempts to mechanically or automatically carry out such electric test of multi-core cables have heretofore been suggested and realized.

For example, there has been developed an apparatus comprising a measuring multi-pole connector or multi-pole insulated terminal stand, to the terminals, of which the cores of a cable are once connected, whereupon the cores are successively and automatically subjected to an insulation test or withstand-voltage test by a measuring instrument through said connector or terminal stand. However, carrying out tests by using such apparatuses takes much time for preparation, connection and disconnection upon completion of the test, and fails to provide an efficient automatic test desired. That is, the preparatory operation for removing the insulating covers from the cores or untwisting the cores twisted in pairs or quads and straightening them in order to connect the cores to the terminals on said connector or terminal stand, the operation for picking up the cores one by one for connection to the terminals or the after-operation for disconnecting the tested cores without damaging them cannot be performed without resort to hands. As a result, these operations require a long time and the ratio which the net time required for inspection and measurement bears to the whole time is small. Thus, even if the measuring operation is automated, it would be impossible to improve the efficiency of operation drastically, since the picking up and connecting operations which occupy the greater part of the process are not automatic.

Further, making a defective contact test or a withstand-voltage test requires application of a relatively high voltage which makes it necessary to provide a substantial distance between adjacent terminals, thus resulting in a disadvantage that the insulated terminal stand or multi-pole connector itself has to be enlarged, and requiring a large operating space.

SUMMARY OF THE INVENTION

An object of this invention is to solve the above described problems and provide a highly efficient and reliable electric testing method most suited for automation and an automatic electric testing apparatus, wherein in testing a multi-core cable, the need for applying particular treatments such as untwisting unit cores, such as pairs or quads, removing the insulating covers and connecting the cores to terminals or connector, is eliminated so as to allow the invidicual cores to be directly tested for defective contact or poor dielectric strength.

Another object of this invention is to achieve an automatic test by arranging picking up, charging, measuring and decision stations in a series of operating regions.

A further object of this invention is to provide an automatic electric testing apparatus which is very compact and efficient.

This invention is arranged to detect a charging current or leakage current flowing through each of the cores of a multi-core cable including a number of cores, such as a communication cable or control cable, thereby deciding whether or not there is a defective contact or an insulation breakdown. The process involves removing sheath from the both ends of such multi-core cable to take out the cores, and collectively holding the cores at their first or near ends adjacent to the testing apparatus in mutually conductive relation while isolating them from each other at their second ends farther away from said testing apparatus. Then, the collectively held first ends of the cores are urged against a movable member formed with a notch having a size corresponding to the core diameter, whereby a core to be picked up is engaged with said notch. As the movable member is moved, a single core is picked up from the group of cores at their near ends. Subsequently, this picked-up core is electrically separated from the group of the core at the first ends and subjected to a relatively high voltage at its first end. On the basis of a charging current or leakage current flowing through said picked-up core, a test is carried out to see if said picked-up core has a defective contact with another core or whether it has a sufficient dielectric strength.

These objects and other objects, features, advantages and aspects of the present invention will become more apparent from the following detailed description of the invention made wth reference to the accompanying drawings.

BRIEF DESCRIPTION OF THE DRAWINGS

FIGS. 6A to 6C are electric circuit diagrams showing a preferred embodiment of the control circuit of the invention;

In the drawings, like reference characters indicate like or corresponding parts.

DESCRIPTION OF THE PREFERRED EMBODIMENTS

Figure 1:
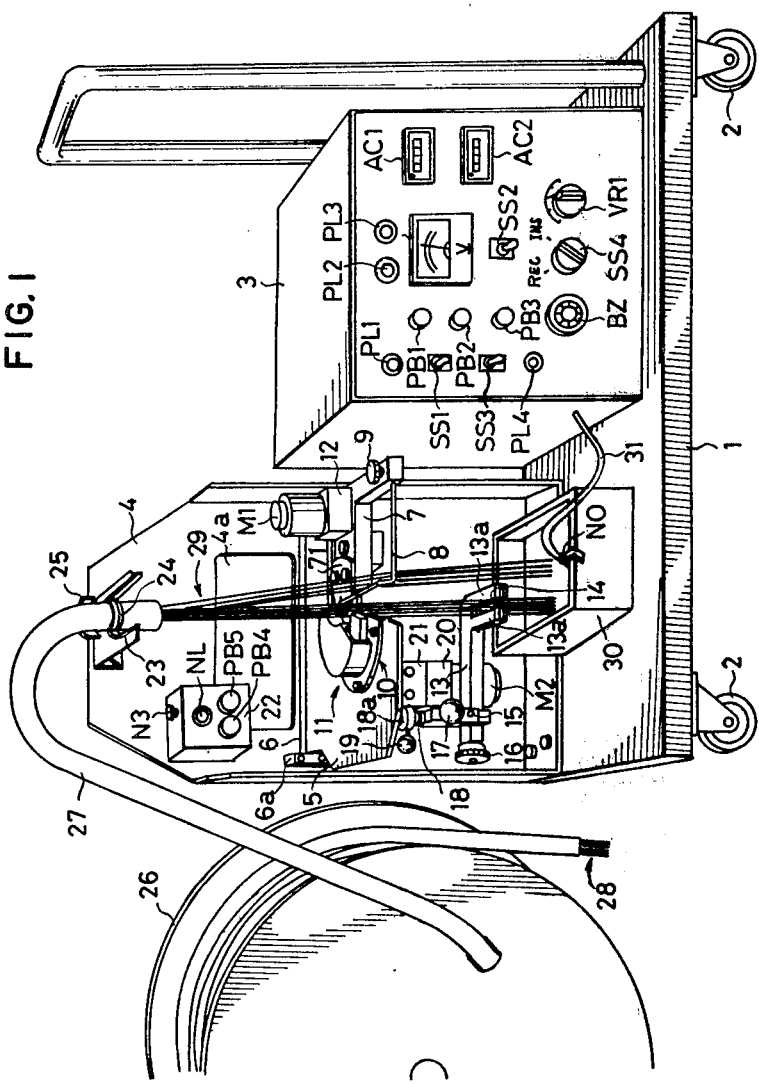
FIG. 1 is an entire perspective view showing an embodiment of the present invention.

FIG. 1 is an entire perspective view showing an embodiment of the invention. A table 1 has a power source unit 3 enclosed in a box mounted thereon, and casters 2, 2 and so on are attached to the lower surface of said table 1 to render it movable. Mounted on the front of said power source unit 3 in the illustrated disposition are a power switch SS1, for turning on or off the power, a pilot lamp PL1 for indicating the power being turned on, a mode change-over switch SS3 for switching the apparatus between a test mode in which the operation will not be stopped even if a defective contact core or other abnormal core is detected and an automatic operation mode in which the operation will be temporarily stopped upon detection of an abnormal core, a voltmeter V1 for indicating the power source voltage, a counter AC1 for counting the number of tested cores, a counter AC2 for counting the number of abnormal cores, and a pilot lamp PL3 and a buzzer BZ for reporting abnormal core detection, each component being later described in more detail. Further, mounted on the front of said power source unit 3 are a high voltage circuit switch SS2 for turning on and off a high voltage circuit for charging cores with electricity, a pilot lamp PL2 for indicating said high voltage circuit being turned, on, a push-button switch PB1 for turning on a pick-up drive motor M1 and a swing drive motor M2, a push-button switch PB2 for turning off said pick-up motor M1 and swing motor M2, a push-button PB3 for forcibly resetting the apparatus after abnormal core detection, and a pilot lamp PL4 for indicating the apparatus being reset. Besides, the unit 3 is provided with a variable resistor VR1 for controlling the speed of revolution of the swing motor M2 and a switch SS4 for mode change-over, as will be later described in more detail. This mode change-over switch SS4 serves to switch the apparatus to "test mode" or to "confirmation mode" by applying the obtained high voltage to pick up detection or measurement electrodes (to be later described as P1, P2, N1, N2) or to a confirmation electrode (to be later described as N3). These components mounted on said power source unit 3 will be described more clearly in conjunction with the description of the operation with reference to the circuit diagram.

Figure 2:
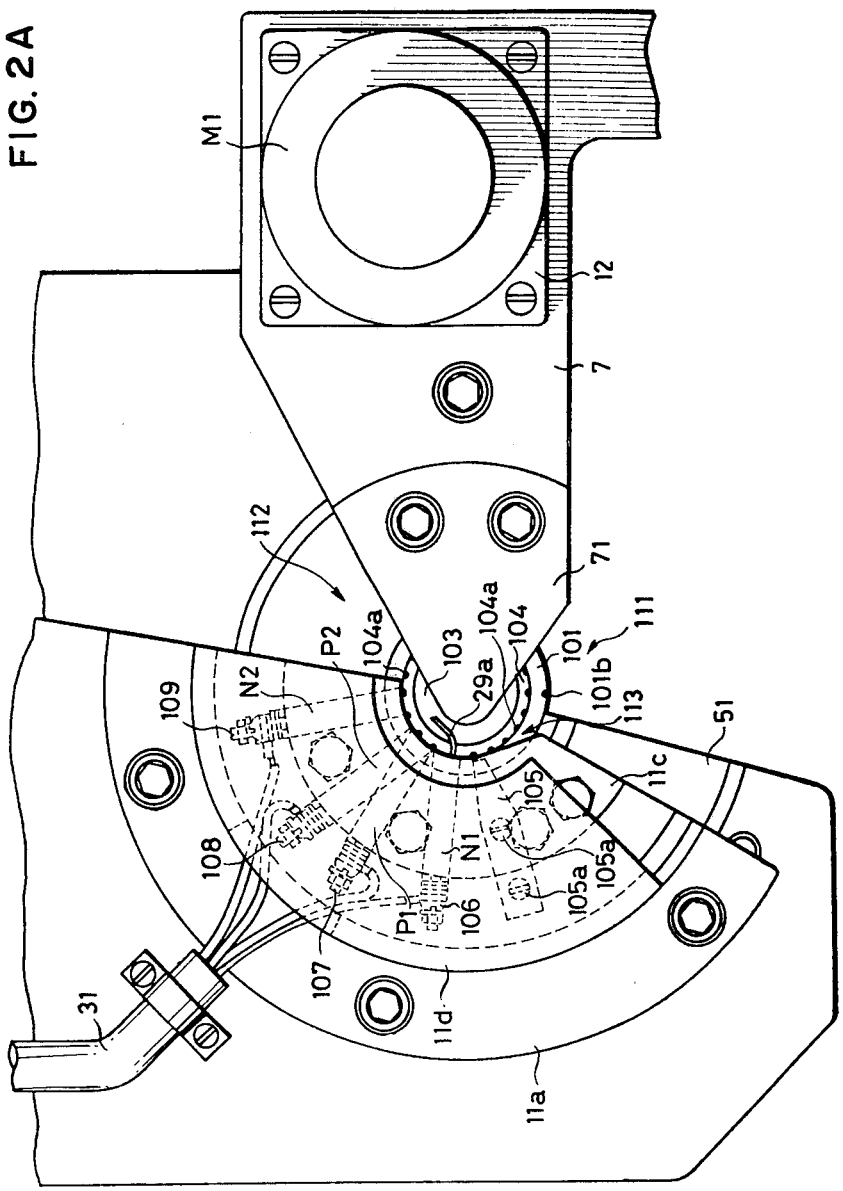
FIGS. 2A and 2B are a plan view and a partial sectional view, respectively, showing in detail the principal parts including a detection unit.

Further, a base plate 4 is vertically fixed to the upper surface of the table 1. A flat substantially L-shaped support plate 5 for mounting a pick-up unit 10 to be later described in detail is vertically pivotally mounted on one side of said base plate 4 at the middle thereof by a shaft 6. Mounted on one section of the substantially L-shape of said support plate 5 is a block 7 which is also substantially L-shaped. This block 7 supports the pick-up motor M1 and a speed reducer 12 to be later described and is adapted to be vertically pivoted integrally with said support plate 5. One end of a rod 8 for separating a group of untested cores from a group of cores being tested which are included in the group of near core ends 29 of a cable 27 brought to said pick-up unit 10 is attached to the end of one section of the block 7. The rod 8 is bent substantially in L-shape to define an opening opposed to said block 7, and the other end of said rod is fixed to the end of the other section of said block 7 by a set screw 9. The various portions of the support plate 5 will be later described in detail together with FIGS. 2A and 2B.

Disposed below said support plate 5 of said base plate 4 are the motor M2, speed reducer 20 and bearing block 21 for vertically periodically rotating, i.e., swinging or oscillating said support plate 5. This swing or oscillation mechanism for the support plate 5 will be later described in detail with reference to FIG. 4.

Similarly, disposed below the support plate 5 is a grip arm 13 attached pivotally in position by a pin 15 for collectively gripping the group of cores being tested included in the group of near core ends 29 of the cable 27. The grip arm 13 is made of a relatively heavy material, e.g., iron, and is formed at one end thereof with clamp members 13a, 13a, which are associated with a movable piece 14. Therefore, the group of near core ends being tested is clamped or gripped by said clamp member 13a and the movable piece 14. The other end of the grip arm 13 is provided with a screw 16 for retaining said movable piece 14. In this way, the group of near core ends 29 is gripped by the grip arm 13. However, since the arm 13 is swingable around the axis of the pin 15, as described above, the group of near core ends 29 gripped thereby is always downward pulled to be stretched. Further, the grip arm 13 has its grip portion turned around the axis of a pin 18a toward the base plate 4 by the twisting force of a coil spring 18, so that the group of near core ends 29 is pressed against the rotary surface of a rotary disc (not shown, to be later described) in the pick-up unit 10 under a suitable pressure. There is provided an adjusting handle or screw 19 for varying the twisting force of the coil spring 18 according to the core diameter. Further, a fixing screw 17 for fixing the turning of the grip arm 13 is installed above the pin 15.

Further, the base plate 4 is formed with a peep window 4a located above said support plate 5 and is provided with a bracket 23 having a U-shaped opening, located above said window 4a, for gripping the cable 27 at its near end side. The bracket 23 cooperates with a belt 24 associated with said bracket 23 to grip the cable 27.

A defective-contact reconfirming unit 22 is disposed above the left end of said peep window 4a in the base plate 4. The reconfirming unit 22 acts to stop the automatic test when the apparatus has detected an abnormal core, such as one having defective contact or poor voltage withstandingness, so as to allow said core to be manually subjected to a reconfirmation test. To this end, a terminal electrode N3 is disposed on the upper surface of the reconfirming unit 22. Disposed on the front surface of the confirming unit 22 are push-button switches PB4 and PB5 which, when depressed, act to provide a high voltage at said terminal electrode N3, and a neon lamp NL for reporting or warning that a high voltage has been obtained at said terminal electrode N3.

The group of near core ends 29 of the cable 27 is immersed in an electrically conductive fluid contained in an electrode vessel 30 and thereby collectively rendered conductive. Further, a common electrode N0 for collective conduction is clamped to the electrode vessel 30 and is connected to said power source unit 3 through a line 31.

The principal portions of the pick-up unit 10 in this embodiment will now be described in more detail with reference to FIGS. 2A and 2B. The block 7 is mounted on one section of the support plate 5, as described above. On the one side of the block 7, the pick-up drive motor M1 and the speed reducer 12 connected thereto are fixed on the upper surface of the block and in the interior thereof there are a through-hole into which the rotary shaft 121 of the motor M1 and hence of the speed reducer 12 extends and a clearance through which a belt 123 to be later described is moved. Fixed on the other side of the block 7 is a block plate 71 which defines the ends of a core charging port 111 and a core discharging port 112 to be later described and which supports a rotary shaft (to be later described). A fixed shaft 102 is attached downward to the pointed end of said block plate 71 and a rotor 103 is mounted on said shaft.

A pulley 122 is mounted on the rotary shaft 121 of said speed reducer 12. Further, a similar pulley (not shown) is attached to said rotor 103 attached to said block plate 71. A belt 123 is entrained around these two pulleys. Further, fitted on the upper peripheral surface of the rotor 103 is a rubber ring 104 formed around the periphery thereof with grooves 104a, 104a and so on having a size somewhat smaller than the core diamteter. Said rotor 103 and said rubber ring 104 comprise an electric rotary disc. A rotary disc 101 to be later described is attached to the lower side of the rotor 103. Therefore, the torque from said motor M1 is transmitted to the rotor 103 by the belt 123, and the rubber ring 104 and rotary disc 101 are rotated by the rotation of the motor M1.

Figure 3:
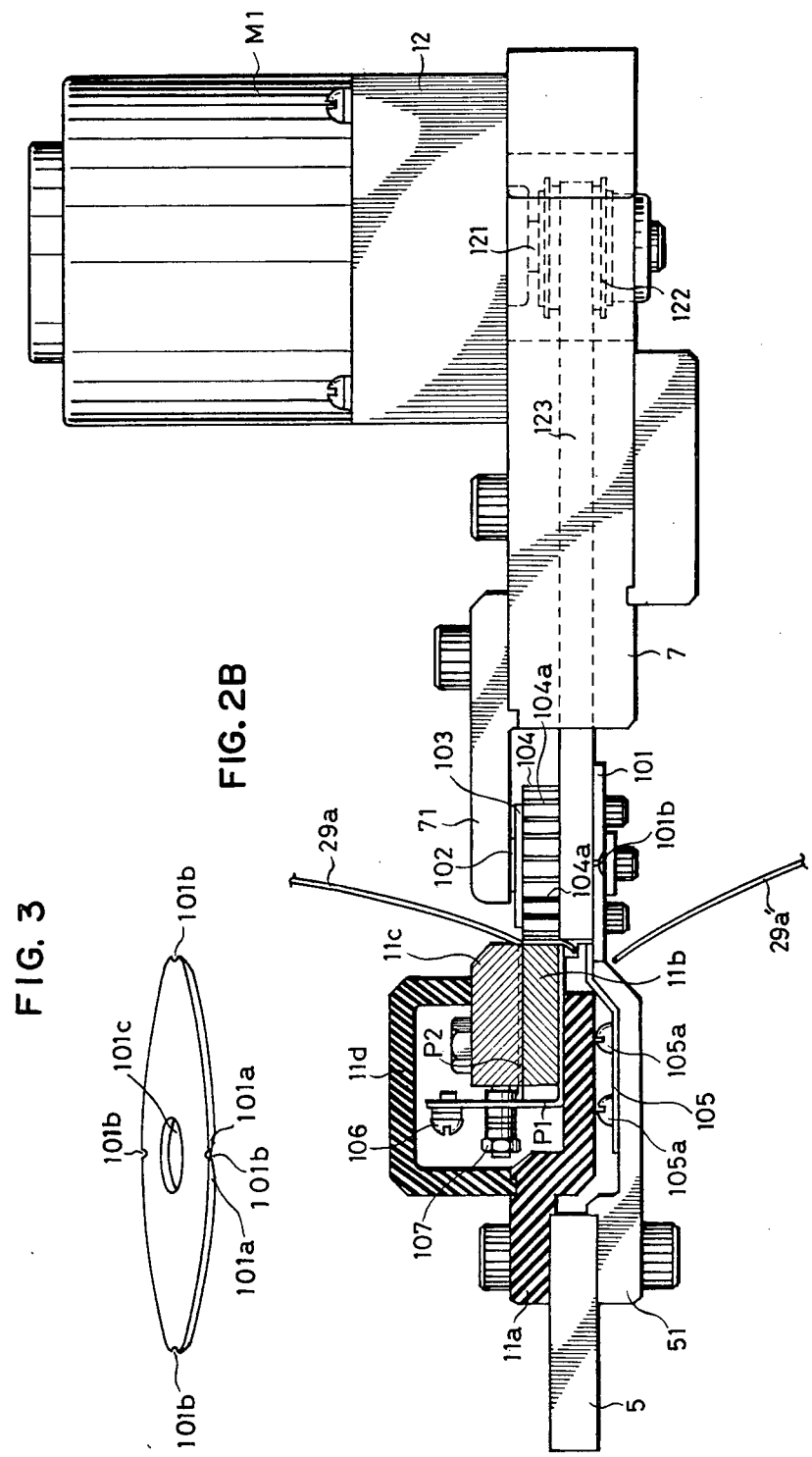
FIG. 3 is a diagrammatic view of a rotary disc.

The rotary disc 101, as shown in FIG. 3, has formed around the outer periphery thereof for example four core picking up notches 101b, 101b and so on, the number being determined by the relation between a cutter 105 and an electrode P1 to be later described. Edge portions 101a, 101a of the disc 101 where such core picking up notch is formed are gradually thinned toward said pick-up notches 101b and rounded at the lower side thereof. The center 101c of the rotary disc 101 is fitted on the rotor 103 and fixed in position. Therefore, it will be readily understood that when the rotary disc 101 is rotated, cores to be picked up are securely arrested by said core picking up notch 101b.

Further, the lower surface of the other section of said support plate 5 is provided with a lid-like member, i.e., a block 51 whose front end is disposed adjacently the outer periphery of the rotary disc 101 with a small clearance therebetween, said block 51 carrying a cutter 105 thereon. The cutter 105 serves to cut and separate a core picked up by said rotary disc 101. To this end, the cutter 105 is positioned by position adjusting screws 105a, 105a in such a manner that the tip of said cutter is located on the upper surface of said rotary disc 101 and extends inwardly beyond the circumference thereof.

The upper surface of the cutter 105 is covered with an insulating cover 11a attached to said support plate 5. The front end of the cover 11a is located at substantially the same position as the tip of said cutter 105, and a step-like clearance is defined in the upper portion. Therefore, as described above, the front cut end of a core 29a cut by the cutter 105 can be moved as confined and isolated in said clearance.

The disposition of the cutter 105 and various electrodes, as is clear from FIG. 2A, is such that as a picked-up core is moved, it is brought into successive contact with the cutter 105, the measuring electrode N1 for charging the core with electricity, the measuring and pick-up detecting electrode P1 for examining whether or not there is a defective contact, the pick-up detecting electrode P2 cooperating with said electrode P1 to detect whether or not a core has been picked up, and the discharging electrode N2 for discharging the remaining electric charge from the core upon completion of the test. Thus, these elements are radially arranged in the order mentioned. The vertical positional relation between these electrodes is such that the measuring electrode P1 and discharging electrode N2 are disposed on the upper surface of the cover 11a and the measuring electrode N1 and pick-up detecting electrode P2 are disposed on the upper surface of a cover 11b placed on said cover 11a, said pick-up detecting electrodes P1 and P2 being opposed to each other with the cover 11b intervening therebetween. These electrodes are bladed electrodes, each disposed so that there is a slight clearance between its tip and the outer periphery of the rubber ring 104. To take the electrode P1 as an example, it is adjustably positioned by a bolt 107. A cover 11c for covering the electrodes N1 and P2 is mounted on said cover 11b and a cover 11d for covering electrically conductive portions between the electrodes N1, N2, P1, P2 and their lead wires are mounted on said cover 11c.

Further, said rubber ring 104, as described above, is formed around its outer periphery with a plurality of grooves 104a, 104a and so on at given intervals. These grooves 104a are substantially rectangular and have a width and a depth which are somewhat smaller than the outer diameter of the covers of cores to be tested. Therefore, cores picked up by the notches 101b of the rotary disc 101, are thrusted into the grooves 104a formed in the outer periphery of the rubber ring 104 and are confined therein. Once cores are thrusted into the grooves 104a, they are strongly held therein by the elasticity of the rubber. In order to thrust picked up cores into the grooves 104a in the manner described above, a notch 113 gradually extending to the outer periphery of the rubber ring 104 is formed at the side of the insulating covers 11b, 11c adjacent to the core charging port 111. Therefore, cores picked up by the rotary disc 101 strike against the covers 11b, 11c and are gradually urged against the rubber ring along the notch 113 and confined in the grooves 104a.

The electrodes N1, N2, P1 and P2 are connected to the power source unit 3 by the line 31.

Figure 4:
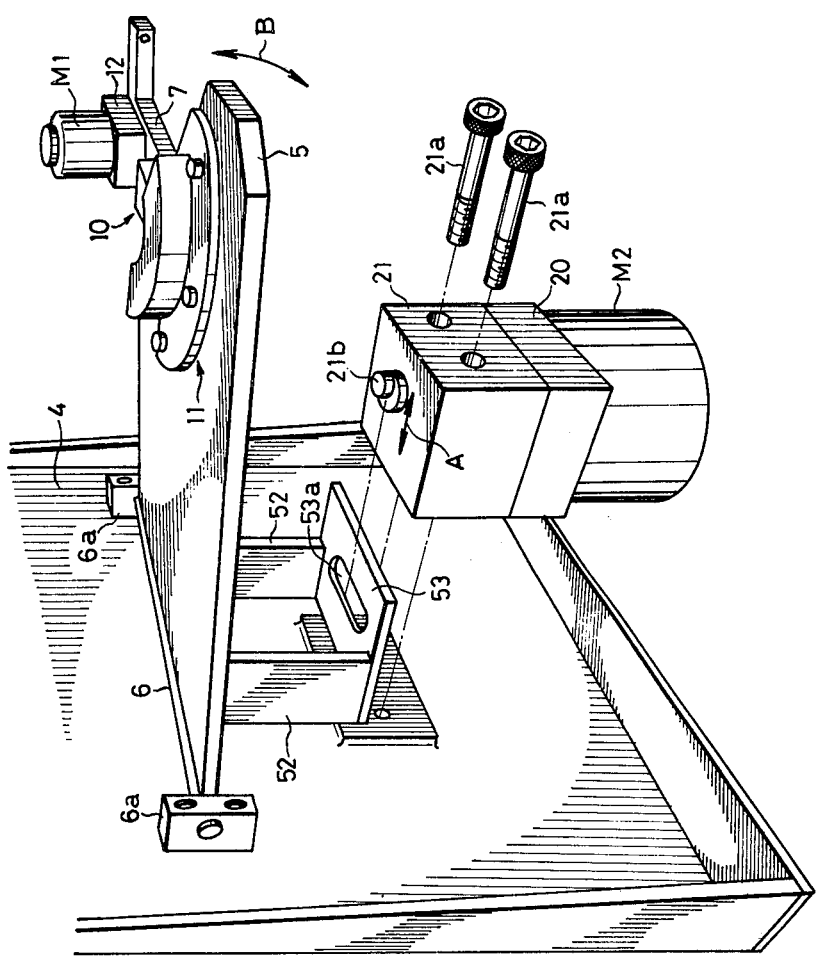
FIG. 4 is a perspective view showing a swing or oscillating mechanism.

The support plate 5 supporting the pick-up unit 10 (block 7) is swung by a vertical-swing mechanism shown in FIG. 4. To this end, the shaft 6 of the support plate 5 is pivotally supported at its both ends by a pair of bearings 52, 52 secured to the lower surface of the support plate 5 adjacent to the base plate 4 and have a plate-like member 53 fixed to the other ends thereof in a bridge fashion. Therefore, it follows that these plate-like members 52, 52 and 53 are constructed integral with the support plate 5. Further, the plate-like member 53 is formed with a widthwise extending elongated opening 53a adapted to receive an eccentric shaft 21b to be later described.

On the other hand, the swing or oscillating drive motor M2 is connected to the speed reducer 20 which, in turn, is connected to the bearing block 21. The eccentric shaft 21b adapted to be driven for rotation by the rotatable shaft of the motor M2 (speed reducer 20) is pivotally mounted on the upper surface of the bearing block 21. When the bearing block 21 is attached to the base plate 4 by bolts 21a, 21a, the eccentric shaft 21b is inserted into the elongated opening 53a in the platelike member 53, as described above.

Therefore, when the eccentric shaft 21b is rotated by the torque imparted thereto from the motor M2 through the speed reducer 20, the peripheral surface of the eccentric shaft is swung in the direction of arrow A. As a result, the plate-like member 53 having said elongated opening 53a engaged with the eccentric shaft 21b is also swung in the direction of allow A. That is, the action of the eccentric shaft 21b converts the torque of the motor M2 into a reciprocating motion in the direction of the arrow, thereby swinging the plate-like member 53 in said direction. As a result, the support plate 5 integral with said plate-like member 53 is oscillated substantially vertically in the direction of arrow B around the axis of said shaft 6. Therefore, it follows that the rotary disc 101 of the pick-up unit 10 installed on the support plate 5 is swung longitudinally of the group of near core ends 29 collectively held by the grip arm 13 as described above. Periodically swinging the rotary disc 101 relative to the group of near core ends 29 in the manner described above makes it very easy to pick up cores one by one from the group of near core ends 29. Further, the rate of oscillation can be varied by a variable resistor VR1 installed in the power source unit 3 according to the diameter or amount of the core and the twist pitch.

Figure 5:
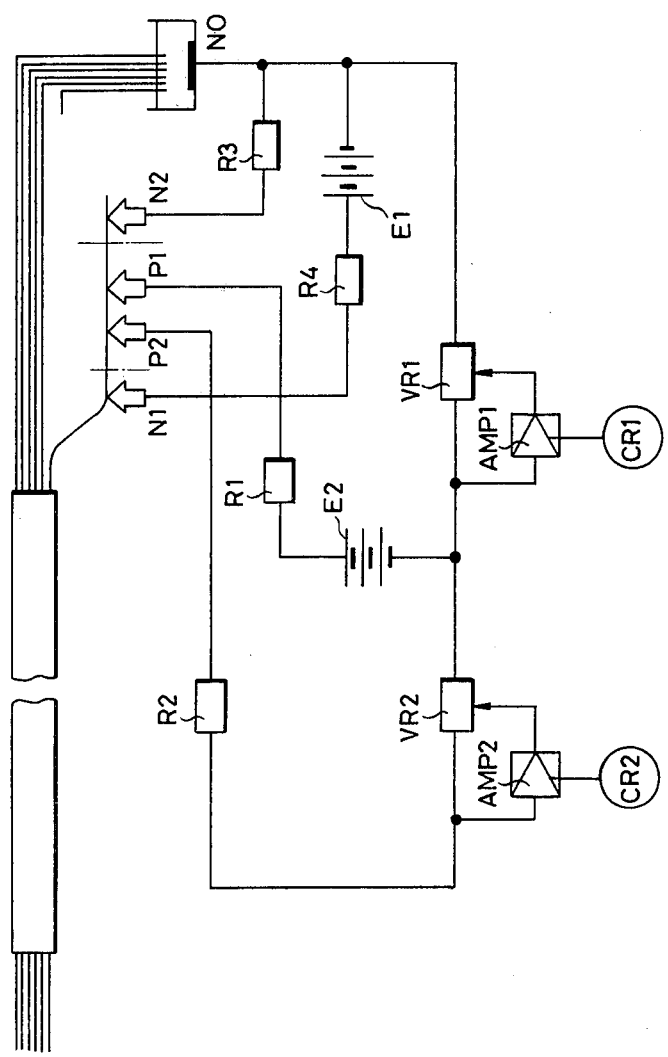
FIG. 5 is an electric circuit diagram showing the principle of the present invention.

FIG. 5 is an electric circuit diagram showing the principle of the invention. The outline of the operation will now be described with reference to FIGS. 1 through 4. First of all, the sheath is removed from the near and farther ends of the cable 27 wound on a reel 26 to take out the groups of core ends 28 and 29, as shown in FIG. 1. Subsequently, the group of farther core ends 28 are isolated from each other so as not to be in conductive contact with each other, while the front end of the group of near core ends 29 is immersed in the electrically conductive fluid in the electrode vessel 30, and at a position a little spaced apart from the electrically conductive fluid said group of near core ends is brought into the core charging port 111 of the pick-up unit 10.

The rotary disc 101 is driven for rotation by the energization of the motor M1, and at a core picking up notch 101b in the disc surface, a single core 29a is picked up from the group of near core ends 29 under pressure and enters said notch 101b, moving while being confined by the block 51 constituting the lid-like member, and it is cut by the cutter 105. At the same time as the core 29a is electrically isolated from the electrode vessel 30, it is moved, while being thrusted into a space between the rubber ring 104 and the covers 11b, 11c, and brought into contact with the electrode N1 and thereby charged with electricity. In this state, all the cores at the farther end side are isolated from each other while all the cores at the near end, except the picked-up one, are in electrical contact with each other. Therefore, inter-core capacitance is produced between the picked-up core and the remaining cores through the insulating covers on the cores along the entire length of the cable, and if there is no defective contact between the picked-up core and the other cores, a charging current flows from a power source E1 and an electric charge is applied to the core 29a. Then, after the electric conduction between the core 29a and the electrode N1 is cut off by the movement of the rotary disc 101, the core 29a is brought into electric contact with the electrodes P1 and P2 at the same time. At this time, a current flows through a series circuit comprising a power source E2, resistors R1, R2 and variable resistor VR2, and a relay CR2 is energized by an amplifier AMP2, with the counter AC1 indicating that a core has been picked up. Whereas contact with the electrode P1 results in the core 29a being recharged with electricity, when there is no defective contact the leakage of the electric charge given to the core 29a is very small, so that the recharging current flowing through a series circuit comprising the electrode P1, resistor R1, power source E2, variable resistor VR1 and electrode N0 is very small. At this time, even if the very small current is amplified by an amplifier AMP1, the relay CR1 will not be actuated. On the basis of the outputs from the relays CR1 and CR2 at this time, a decision circuit RC comprising, e.g., NAND circuit decides that there is no defective contact, and the result is displayed by a display device DIS. As the rotary disc 101 continues rotating, the core 29a leaves the electrodes P1 and P2 and comes in electric contact with the electrode N2 to have its electric charge removed therefrom through the resistor R3.

The above description refers to a case where there is no defective contact between cores. However, if there is defective contact bwetween cores, the recharging current flowing in from the electrode P1 is increased and the relay CR1 is actuated, whreby the decision circuit RC decides that there is a defective contact.

Figure 6A:
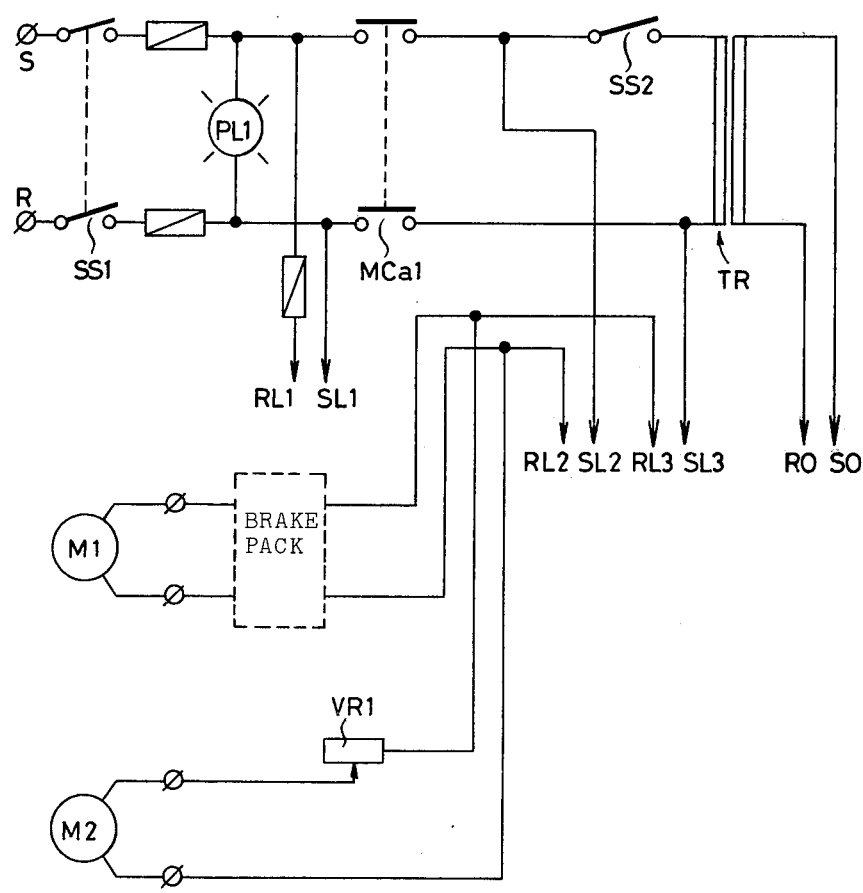
Figure 6C:
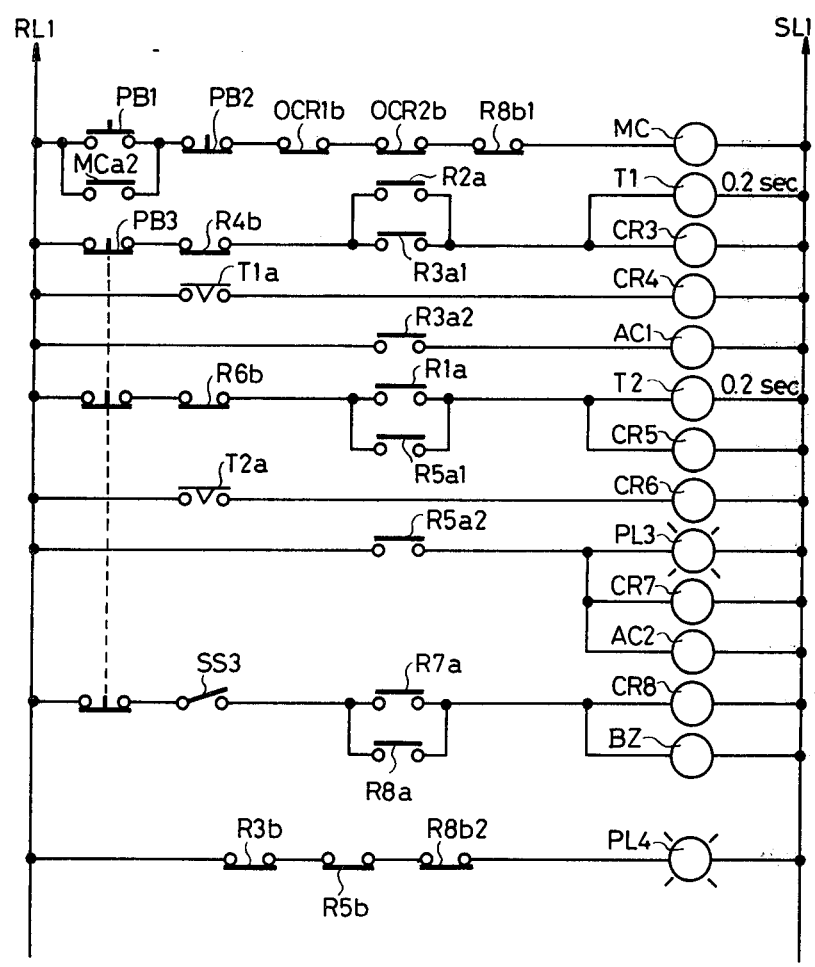

FIGS. 6A, 6B and 6C are electric circuit diagrams showing a preferred embodiment of a control circuit. The operation of this embodiment will now be described with reference to FIGS. 6A through 6C.

First of all, the cores at the group of farther core ends 28 of the cable 27 to be tested are isolated from each other. The cores at the near end side of the cable 27 are firmly gripped by the belt 24 and bracket 23. Further, the group of near core ends 29 taken out is gripped at its front end between the clamp members 13a and 13b by tightening the screw 16 of the grip arm 13. Therefore, the group of near core ends 29 of the cable 27 is firmly gripped above and below the pick-up unit 10. The group of near core ends 29 gripped by the grip arm 13 is pulled downwardly by the weight of the arm 13 to be brought into a relatively streched state, with its front end immersed in the electrically conductive fluid (e.g., common-salt water or common salt containing pasty material) contained in the electrode vessel 30. Therefore, the cores at the group of near core ends 29 are collectively rendered conductive by the common electrode N0. The group of exposed near core ends 29 of the multi-core cable 27 is collectively held in this way and brought to the core charging port 111 and urged against the peripheral surface of the rotary disc 101 by the rotation of the arm 13.

Subsequently, the power switch SS1 on the power source unit 3 is closed. Accordingly, the pilot lamp PL1 is lighted to indicate that the power has been turned on, while the pilot lamp PL4 is lighted to indicate that the control circuit is in a reset (initial) state. Thereafter, either the "inspection mode" or the "reconfirmation mode" is selected by the mode changeover switch SS4 on the power source unit 3. Reference will first be made to a case where the "inspection mode" has been selected. Further, whether the apparatus should be set to the "automatic stop mode" or not is decided by the mode changeover switch SS3. Reference will first be made to a case where it has been set to "automatic stop mode." The high voltage circuit switch SS2 is closed to connect the primary side of a transformer TR. The secondary side of this transformer TR is connected to the inputs of two rectifier circuits REC1 and REC2. Thereafter, the push button PB1 on the unit 3 is depressed. Therefore, an electromagnetic relay MC is energized to have its normally opened contacts MC$a$1 and MC$a$2 closed and its normally closed contacts MC$b$1 and MC$b$2 opened. As a result, the pick-up drive motor M1 and swing drive motor M2 are energized to start rotation, while dc outputs at a high voltage (about 1,000 V; this value can be changed to any other value by adding a tap selection function to said switch SS2) are obtained from said two rectified circuits REC1 and REC2. As a result, the voltmeter V1 indicates this voltage and the pilot lamp PL2 is lighted to indicate that the high voltage circuit has been turned on.

As described above, the depression of the push-button switch PB1 causes the motors M1 and M2 to start rotation. As a result, the torque from the motor M1 is transmitted to the rotary disc 101 of the pick-up unit 10 through the speed reducer 12 and belt 123, causing the rotary disc 101 abutting against said group of near core ends 29 to start rotation. Concurrently, the torque from the motor M2 is transmitted to the eccentric shaft 21$b$ through the speed reducer 20, thus causing the support plate 5 and hence the pick-up unit 10 to swing longitudinally of the group of near core ends 29. In this way, a core 29$a$ (FIG. 2B) is picked up from said group of near core ends 29 by a pick-up notch 101$b$ of the rotary disc 101 and reaches the position of the cutter 105 with the rotation of said disc. At this time, the picked-up core 29$a$ has been thrusted into a groove 104$a$ of the rubber ring 104 rotating together with the rotary disc 101. The core 29$a$ is cut by the cutter 105 at that position. Therefore, the remainder of the core 29$a$ after its front end 29$a$' has been cut off is electrically isolated from the other cores both at the farther end and at the near end. The core 29$a$ separated from the common electrode N0 in this way is confined in the groove 104$a$ of said rubber ring 104 and further moved.

The picked-up core 29$a$ moved with the rotation of the rotary disc 101 and hence the rubber ring 104 reaches the position of the bladed electrode N1. As can be seen from FIG. 6B, the bladed electrode N1 has been given a high dc voltage from the rectifier circuit REC2. Therefore, when the bladed electrode N1 cuts the insulating cover on the core 29$a$ to contact the conductor of said core 29$a$, a high voltage is applied to this core 29$a$. The electric test according to this invention is one for examining, by application of a high voltage to a picked-up core (conductor) in the manner described above, whether or not there is a so-called defective contact state between individual cores namely an abnormal conductive contact or too-low insulation resistance or dielectric strength exists.

FIGS. 7A through 7D are graphs showing the relation between the positional relation between the testing electrodes and changes with time of the magnitude of a current flowing through a moving picked-up core.

The series of operations for a normal core will first be described. As described above, when the bladed electrode N1 contacts the picked-up core 29$a$ (at its cut end), a distributed capacitance formed between the core 29$a$ and all the remaining cores is charged and the resulting charging current (i.e., the sum of a current Ic flowing through the electrostatic capacitance and a current I1 flowing through the leakage resistance) has a wave form I shown in FIG. 7B. That is, if the picked up core 29$a$ is normal, the charging current I is nearly equal to Ic, so that it is rapidly saturated. The rubber ring 104 continues rotating and, with the conductive contact between the picked-up core 29$a$ and the bladed electrode N1 terminated, said charging is completed. Therefore, if the core is normal, the insulating resistance, i.e., leakage resistance is high, so that said electric charge will be very slowly discharged from this point of time.

Figure 7A:
FIG. 7A is a diagrammatic view showing the movement of a core and the position of bladed electrodes.
Figure 7B:
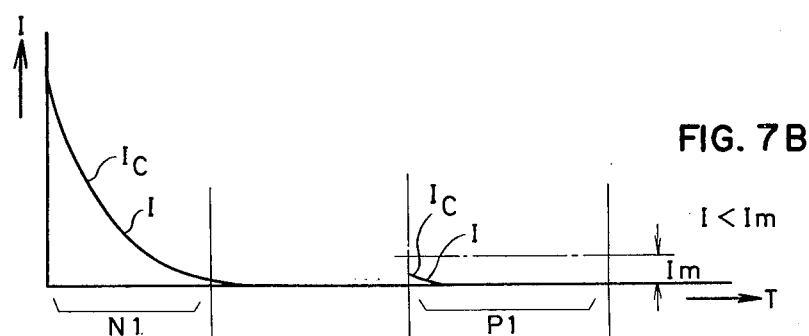
FIGS. 7B to 7D show current wave forms for explanation of the operation.

Subsequently, the rubber ring 104 is rotated and the core 29$a$ confined in the groove 104$a$ reaches the position of the bladed electrodes P1 and P2, as shown in FIG. 7A. Thus, the two bladed electrodes P1 and P2 are shorted to each other through the core 29$a$. Therefore, there is formed a series closed loop of positive (+) output end of rectifier circuit REC1—current limiting resistor R1—mode changeover switch SS4—bladed electrode P1—core conductor—bladed electrode P2—current limiting resistor R2—variable resistor VR2—negative (−) output end (grounded) of rectifier circuit REC1. Therefore, a current flows through the variable resistor VR2, and by suitably setting the sensitivity of the amplifier AMP2, the relay RC2 is energized. As a result, the normally open contact R2$a$ of this relay CR2 is closed, thus starting the timer T1 and energizing the relay CR3. When the relay CR3 is energized, its normally open contacts R3$a$1 and R3$a$2 are closed and its normally closed contact R3$b$ is opened. Therefore, the counter AC1 is energized and advanced one step. That is, this counter AC1 is advanced one step each time a normal core is picked up. Concurrently, the pilot lamp PL4 is turned off, indicating that a core is being inspected. That the bladed electrode P1 contacts the conductor of the picked-up core 29$a$ means that, as shown in FIG. 7B, at this time said core 29$a$ is recharged with electricity. However, in the case of this normal core, the recharging current I flowing successively through the bladed electrode P1, core conductor, common electrode N0 and to ground, is very small. Therefore, the current flowing through the variable resistor VR1 is small and the voltage drop caused thereby is also small. Further, the sensitivity of the amplifier AMP1 is preset so that it energizes the relay CR1 only when the charging current has a predetermined value of Im or above. Therefore, with the very small recharging current as described above, the relay CR1 will not be energized. And, the rubber ring 104 continues rotating and the conductive contact between the picked up core 29$a$ and the bladed electrodes P1, P2 is terminated.

Thereafter, the timer T1 for automatically resetting the control circuit is started as described above, and about 0.2 sec after it is started, the timer T1$a$ is closed. Accordingly, the relay RC4 is energized to have its normally closed contact R4$b$ opened. Therefore, said timer T1 and relay CR3 are deenergized and the pilot lamp PL4 is lighted again, indicating the reset state.

With the rotation of the rubber ring 104, the picked up core 29$a$ reaches the position of the discharging electrode N2. Therefore, the core 29$a$ charged with electricity to a high voltage by the electrodes P1 and P2 as described above is grounded through the resistor R3. As a result, the electric charge on the core 29$a$ is discharged through the resistor R3, thus lowering the potential thereof to the extent that the human body is safe from danger when it comes in contact therewith.

With further rotation of the rubber ring 104, the core 29a, confined in the groove 104a, is moved to the core discharging port 112 and leaves the rubber ring 104. In this way, a cycle of a "defective contact test" is completed.

Next, referring to a case where a picked up core is in a completely defective contact state, a series of operations will be described. A core 29a picked up by a pickup notch 101b of the rotary disc 101 and being moved as confined in a groove 104a of the rubber ring 104 and having its front end cut off by said cutter 105 is first charged with electricity by the bladed electrode N1, as shown in FIG. 7A. Since this core 29a is completely defective contact, its insulation resistance is much lower than that when the core is normal. Therefore, the charging current is mostly a leakage current I1 and as shown by a wave form I' in FIG. 7C, its value remains very high.

Figure 7C:
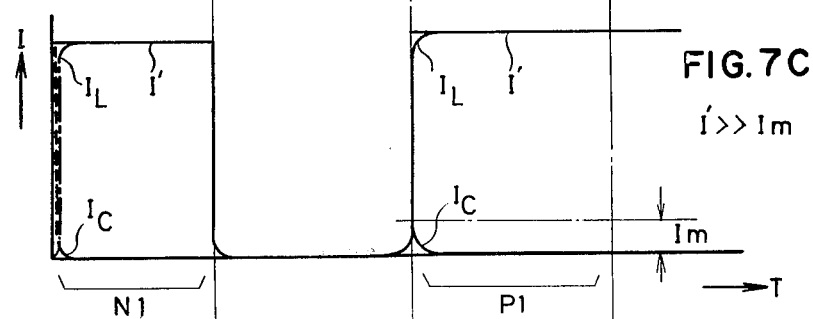

Subsequently, the rubber ring 104 continues rotating and the picked up, cut and charged core 29a reaches the position of the two bladed electrodes P1 and P2, as shown in FIG. 7A. Therefore, the core 29a is recharged with electricity by the high voltage provided by the rectifier circuit REC1 through the electrode P1 (P2). Since the insulation resistance, i.e., leakage resistance of this core 29a is very low, as described above, the recharging current I' is much greater than the predetermined value of Im, as shown in FIG. 7C. In other words, the bladed electrodes P1, P2 and the near end side common electrode N0 are shorted to each other through the core 29a. Therefore, the current I' from the rectifier circuit REC1 hardly flows through the path containing the variable resistor VR2 and instead it flows through the current limiting resistor R1, electrodes P1, P2, core 29a, common electrode N0 and variable resistor VR1. Therefore, by setting the sensitivity of the amplifier AMP1 suitably so that it may energize the relay CR1 in response to a current having the predetermined value of Im or above, the relay CR1 is energized to have its normally open contact R1a closed.

The closing of the contact R1a causes the energization of the timer T2, which, like the timer T1, may be one serving for automatic resetting, and the relay RC5. Therefore, the normally open contacts R5a1 and R5a2 of the relay CR5 are closed so that the said relay RC5 is self-held, the pilot lamp PL3 is lighted and the relay CR7 and counter AC2 are energized. At this time, since the normally closed contact R5b of the relay CR5 is opened, the pilot lamp PL4 is put out. The lighting of the pilot lamp PL3 indicates that the apparatus has detected a "defective contacted" core, and the counter AC2 counts the number.

When the relay CR7 is energized, its normally open contact R7a is closed, so that the relay CR8 and buzzer BZ are energized. The buzzer BZ is used to report the detection of a defective contact core. Further, the relay CR8 is energized to have its normally open contact R8a closed and is thereby self-held or energized, its normally closed contacts R8b1 and R8b2 being opened. Therefore, the electromagnetic relay MC is deenergized, so that its normally open contacts MCa1 and MCa2 are opened and its normally closed contacts MCb1 and MCb2 are closed. As a result, the supply of power to the motors M1 and M2 is stopped and hence the rotary disc 101 and rubber ring 104 stop rotation and the support plate 5 stops vertical swinging or oscillation. Along with this, the primary side of the transformer TR is cut off, so that no high dc voltage can be obtained. Further, smoothing capacitors C1 and C2 are discharged, preventing the application of high voltage to the electrodes P1, P2 and N1. When a defective contact core is detected in this manner, the apparatus is stopped and sounds the buzzer BZ to report the detection.

Thereafter, in order to reset the apparatus, the timer T2 is activated and the relay CR6 is deenergized, and the push-button switch PB3 is depressed. Therefore, the timers T1, T2 and the relays CR3, CR5, CR8 are all reset to allow the apparatus to be used again, and the pilot lamp PL4 is lighted.

Although a defective contact is detected in the manner described above, it is necessary to reconfirm the nature of such defective contact in order to know whether the tested core truly represents a defective contact or merely presents a quasi defective contact state for some reason or other. To this end, the defective contact core (conductor) is then connected to the terminal electrode N3 installed on the confirmation unit 22. The mode change-over switch SS4 is switched to the "confirmation mode" and the push-button switch PB1 is depressed. Therefore, the electromagnetic relay MC is energized to have its normally opened contacts MCa1, MCa2 closed and normally closed MCb1, MCb2 opened. Since the motor drive power sources RL2, SL2 and RL3, SL3 have been cut off by said switch SS4, the motors M1 and M2 are not energized. Further, when the electromagnetic relay MC is energized, the pilot lamp PL2 and neon lamp NL are lighted to indicate that a high voltage is obtained at the confirmation unit 22.

After the confirmation unit 22 has been activated in this way, the push-button switch PB4 is depressed. Therefore, the high voltage dc output from the rectifier circuit N3 is derived at the terminal electrode N3 and the defective contact core connected to the said electrode N3, is charged with electricity. The charging current will remain to be very large as shown in FIG. 7C, if the core truly exhibits a "defective contact" but will be rapidly saturated as shown in FIG. 7B if it does not have a defective contact. Subsequently, the pushbutton switch PB5 is depressed. Therefore, the high voltage dc output from the rectifier circuit REC1 is imparted to the terminal electrode N3. In addition, the reason why two high voltage circuits are provided is that a considerably large current is required to initially charge a picked up core with electricity, in consideration of which this charging circuit is constructed separately. Therefore, at this time, said core is recharged with electricity and if it is truly defective contact the recharging current is very large as shown in FIG. 7C and the defective contact detecting relay CR1 is energized as in the case described above, but if it is not "defective contact" the recharging current is very small as shown in FIG. 7B and the relay CR1 is not energized.

Supposing that the relay CR1 has been energized, as in the case described above, the closing of its normally opened contact R1a causes the energization of the timer T2 and relay CR5. The ensuring operations are the same as those for the detection of no "defective contact" described above and a repetition of the description thereof is not necessary.

Thereafter, the mode change-over switch SS4 is switched to the "inspection mode." Therefore, the high voltage dc output to the confirmation unit 22 is cut off and the terminal electrode N3 is connected to the ground potential. In addition, if the series of operations for inspection are carried out with the defective contact core connected to the terminal electrode N3, all the cores mating with the defective contact core can be easily detected.

A series of operations which take place when a picked-up core is in a half defective contact state will now be described. As shown in FIG. 7A, a picked up core 29a reaches the position of the bladed electrode N1 and is charged with electricity. Since this core 29a is half defective contact, the leakage resistance, i.e., insulation resistance is somewhat lower than in the case of a normal core. Therefore, the charging current which is given as the sum of a leakage current I1 and a current Ic flowing through the capacitor of the capacity is slowly saturated as shown by a wave form I'' in FIG. 7D.

Figure 7D:
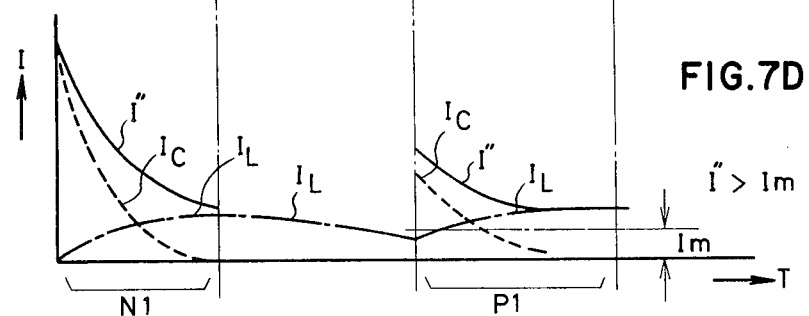

Subsequently, the core 29a is moved to the position of the electrodes P1 and P2, as shown in FIG. 7A, and recharged with electricity, as shown in FIG. 7D. Since the insulation resistance in the case of "half defective contact" is rather low, the electric charge given by the electrode N1 as described above is slowly discharged in the form of a leakage current shown by a wave form I1 in FIG. 7D. Therefore, the recharging current I'' (Ic+I1) at this time is greater than the predetermined value of Im and takes a value approximately intermediate between one for a normal case and one for a perfectly defective contactive case, whereby the intermediate value will vary according to the defective contact state. Therefore, the variable resistor VR1 is adjusted to provide a particular value depending upon the core size (conductor diameter and insulation source) and the kind of the insulating material.

In addition, if the recharging current I'' is nearly equal to the predetermined value of Im, the two relays CR1 and CR2 are both energized. Therefore, the ensuring operations are a combination of the operations for a "normal case" and for a "perfectly defective contact case." In this way, the picked up core can be decided to be half defective contact on the basis of the fact that the two relays CR1 and CR2 are energized.

Finally, reference will be made to a case where the mode change-over switch SS3 is opened and the mode selected is not "automatic stop mode". In the "automatic stop mode" described above, when a "perfect defective contact" or a half defective contact is detected, the relay CR8 is energized to deenergize and stop the motors M1 and M2. In this mode, however, since the switch SS3 is opened, the relay CR8 is not energized. Therefore, if an abnormal core is detected, this fact is indicated only by the lighting of the pilot lamp PL3, while the series of inspection or test steps, pick-up—cutting—charging—discharging, go on without stopping.

In addition, in the above embodiment, the two bladed electrodes P1 and P2 are shorted to each other through a core conductor, whereby the relay CR2 for confirmation of core pick-up or for counting the number of picked-up cores is energized. However, this may be effected by providing spring electrode adapted to be actuated by a core moving as confined by the rubber ring 104 and a fixed electrdoe associated with said spring electrode. That is, through not shown, the arrangement may be such that the spring electrode is urged by a core into contact with the fixed electrode so that the resulting current may energize the relay CR2.

Further, use may be made of an arrangement wherein light emitting means and light receiving means, such as a light emitting diode and a phototransistor, are disposed on both sides of the path of travel of cores so that a pick-up detection signal may be obtained upon passage of a core. An arrangement wherein a proximity switch adapted to be actuated by the approach of a conductor thereto may be disposed along the path of travel of cores so that a pick-up detection signal may be obtained when a picked-up core conductor approaches or passes by said proximity switch. An arrangement wherein a power source is connected between the cutter for cutting cores and an electrically conductive fluid containing water vessel for collective conduction may be used whereby a charging current or conduction current flowing between the cutter and water vessel just before the core is cut by the cutter, is used as a pick-up detection signal. Further, an initial charging current which flows instantly when a picked-up core comes in contact with the measuring electrode N1 may be used as a core pick-up detection signal. In that case, however, a special circuit is required which is capable of measuring a very small charging current in a very short time.

The modifications described above are suitable examples of the pick-up detecting means, and in each case, the electrode P2 becomes unnecessary.

In the above described embodiment of the invention, a core is charged with electricity by the electrode N1 for measurement and recharged with electricity by the electrode P1 for measurement and the magnitude of the recharging current is used to decide whether or not there is defective contact. According to this method, the quality of a core namely whether it satisifies certain electrical characteristics such as dielectric strength etc. can be decided at the same time when said core pick-up signal is obtained, without using a time delay device such as a timer and so on. Futher, use may be made of an arrangement wherein in order to reduce the number of electrodes used for measurement, the electrode N1 for measurement having a suitably selected width is used alone and a core comes in conductive contact with the electrode N1 for a predetermined period of time and then a decision on defective contact is made on the basis of the magnitude of the charging current after the current which flows into the electrostatic capacitor has decreased. Further, the embodiment may be structured such that a charging current may be discharged to the electrode N1 after a defective contact decision has been made. In that case, however, a time or time delay device for starting the operation at the moment of electric contact with a core and for making a defective contact test upon the lapse of a predetermined period of time, is required. Further, since it is desired that the time of electric contact between a core and the measuring electrode be relatively long, the width of the bladed electrode may be increased, an arcuate electrode extending along the path of travel of cores may be used and so on according to the need.

Figure 8:
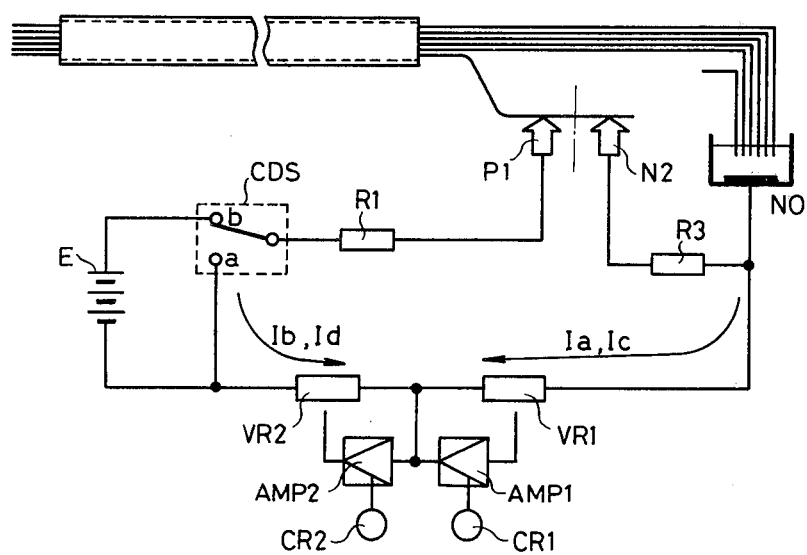
FIG. 8 shows a block diagram of another embodiment for testing of a defective contact using only two bladed electrodes.
Figure 9:
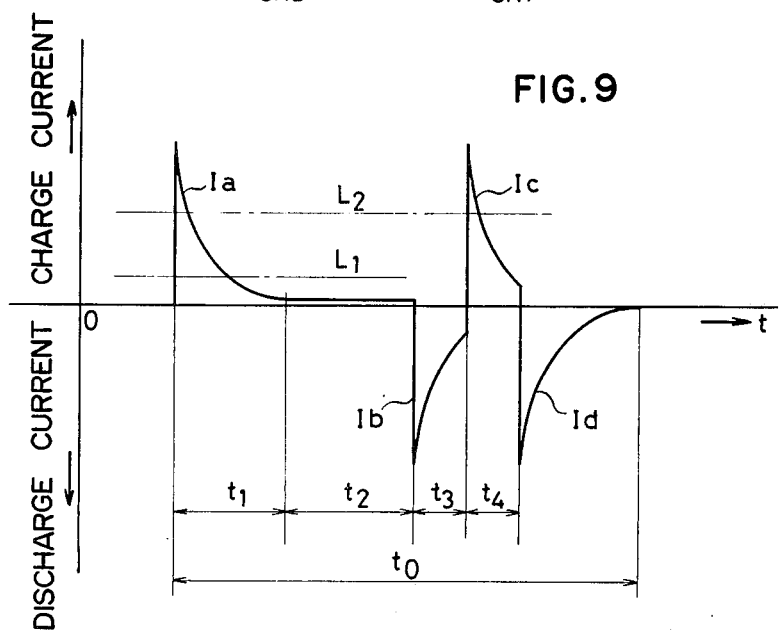
FIG. 9 shows a wave form of the signal in accordance with the FIG. 8 embodiment.

FIG. 8 shows a block diagram of another embodiment for testing of "defective contact" faults using only two bladed electrodes P1 and N2. FIG. 9 shows a wave form of the signal in accordance with the FIG. 8 embodiment. The FIG. 8 embodiment comprises a charge/discharge selecting switch CDS connected to the resistor R1 a charging contact b of which is connected to the voltage source E and a discharging contact a of which is connected to the variable reisistor VR2. Now the defective contact test in accordance with the FIG. 8 embodiment will be described with reference to FIGS. 8 and 9. Assuming that the switch CDS has been switched to the contact b, if and when the bladed electrode P1 comes to be in contact with the conductor of the picked up core, a charging current Ia flows from the voltage source E through the charge/discharge selecting switch CDS and the resistor R1 to the electrode P1, whereby the potential differences across the variable resistors VR1 and VR2 are detected and amplified by the amplifiers AMP1 and AMP2, respectively, to energize the relays CR1 and CR2, respectively. Energization of the relay CR2 causes the timers T1, T2, T3 and T4 to be actuated in turn, whereby the change-over switch CDS is reverse switched. The defective contact test is effected during the time period t2 on the basis of whether or not the relay CR1 has been energized in that period of time t2. If the current Ia flowing through the variable resistor VR1 exceeds the current level L1 in the time period t2, then the relay CR1 is energized, thereby to determine that there is a defective contact. After the lapse of the defective contact test period t2, the switch CDS is switched to the contact "a" whereby an electric charge in the cable is discharged by way of a discharging current Ib during the following time period t3. Thereafter the switch CDS is switched to the contact "b" for the purpose of recharging. The recharging current Ic flowing at this time causes the relay CR2 to be energized again. Whether or not the relay CR2 has been energized in the recharging time period determines the relation $t0>t1+t2+t3$ has been maintained. It could happen that the bladed electrode P1 wears because of repetitive testing operations, resulting in a decreased contact time period t0. Further it could happen that because of wear of the tip end of the bladed electrode P1 the contact period t0 becomes shorter than the required charging period t1. In such an event, determination is made as if the core is proper even if the cable being tested includes a defective contact fault. In order to detect such an improper determination, thereby to avoid any eroneous test, therefore, the testing process in accordance with the FIGS. 8 and 9 embodiment comprises the step of confirming whether the bladed electrode P1 has been in proper electrical contact with the conductor of the picked up core during the defective contact test period t2 by detecting the above described recharging current. More specifically, according to the FIGS. 8 and 9 embodiment, after the picked up core is charged in the charging period t1 and a defective contact test is effected during the test period t2, the picked up core is immediately discharged in the following discharging period t3 which is further followed by the recharging operation, wherein establishment of a sufficient recharging current ensures an electrical contact of the bladed electrode P1 to the picked up core immediately before the recharging period t4. If and when a sufficient recharging current is not detected, indication is made that the test is not completed and the test is immediately discontinued. As a result, an eroneous test because of improper contact of the bladed electrode with the picked up core can be fully prevented. After the recharging time period t4, the switch CDS is again switched to the discharge contact "a", whereby the electric charge in the core being tested is discharged. The picked up core coming out of contact with the bladed electrode P1 then comes in contact with the discharging electrode N2, whereby any remaining charge not yet discharged through the bladed contact P1 is fully discharged. As a matter of practice, the discharging electrode N2 can be dispensed with. Furthermore, electrical contact of the bladed electrode P1 with the picked up core may also be confirmed by detecting the discharging current Ib. In such a modification, the recharging period t4 and any operation thereafter can be dispensed with.

Further, the collective conductor means used for collectively rendering the cores of a cable conductive at their near ends in this invention has been shown in the form of an electrode vessel filled with an electrically conductive fluid. Examples of such electrically conductive fluid are electrolytic solutions containing common salt or other salts, alkalis or acids; pasty or colloidal liquids containing said electrolytes; low melting point metals heated and molten by a heater; and any other suitable materials that exhibit fluidity in use and that, when contained in a vessel, form a liquid surface and are capable of electrically contacting a core inserted below the liquid surface.

As has so far been described, in this embodiment, a disc with pick-up notches has been shown as an example of the core moving member of core picking up means, but an endless belt having core pick-up grooves or a reciprocable plate-like member having core pick-up grooves may be used.

As described above, in this embodiment, since cores to be tested are cut between the core picking up device and the cut ends without cutting cores to an even length and extracting them at their cut ends, reliable electric contact between cores at their cut ends can be obtained, so that a highly reliable test is possible. The reason therefore is that since generally the cores of a communication cable are twisted in pairs or quads to constitute pairs or quads, if each core is extracted one by one at their cut ends of the cores cut to an even length and bundled, then at a place remote from the pick-up device the extracting force is transmitted to the pair or quad which contains the picked-up core, tending to simultaneously extract while said pair or quad, or a plurality of cores such as pairs or quads contacting the first-mentioned pair or quad, thus failing to satisfy the condition that "all the cores contained in the remaining group should be conductively contacted with each other." That is, since no voltage is applied to the thus extracted cores, there is a disadvantage that some cores are left out of the test, whereas in this embodiment, such disadvantage is eliminated and all the cores can be reliably tested.

In the embodiment described above, a test for defective contact in which the magnitude of the charging current between adjacent cores is investigated has been shown as an example of an electric test. In this invention, since a high voltage is applied to a picked up core alone after the latter is cut to be out of continuity with the remaining core, a sufficiently high voltage can be safely applied without being influenced by the leakage resistance between the cores at the cable end. Therefore, besides the test for defective contact in the embodiment described above, the invention can be applied to other various electric tests applying a high voltage, including a withstand-voltage or dielectric strength test in which a high voltage is applied between adjacent cores to see whether or not they can withstand the voltage for a specified period of time. In addition, in this case, the test may be made by using measuring electrodes having an increased width and by applying a specified high voltage for a predetermined period of time in combination with the rate of movement of cores. Depending upon the type of the power source employed, tests using either dc or ac are possible.

The present invention so far described in detail enables tests of cores for defective contact or for dielectric strength using a high voltage, to be easily and reliably automated, and provides remarkable merits in the guarantee of the quality of multi-core cables such as communication cables and the reduction of cost.

Although this invention has been described and illustrated in detail, it is to be clearly understood that the same is by way of illustration and example only and is not to be taken by way of limitation, the spirit and scope of this invention being limited only by the terms appended claims.

What is claimed is:

1. An apparatus for electrically testing a multi-core cable having a first end and a second end and including a plurality of insulated cores, each core comprising a conductor wire and an insulation covering said conductor wire, comprising: holding means for collectively holding said insulated cores of said multi-core cable at said first end, collective conductor means for collectively rendering conductive the conductor wires of all the cores of said multi-core cable at said first end, the cores of said multi-core cable being isolated from each other at said second end, core pick-up means operatively coupled to said core holding means for picking up said cores on a one by one basis at said first end, said core pick-up means transferring said picked up core along a predetermined path of travel, core separating means provided along said path of travel of said core pick-up means for electrically separating a core picked up by said core pick-up means from said collective conductor means, measuring electrode means provided at said first end along said path of travel of said core pick-up means and adapted to be in contact with the conductor of said picked up and electrically separated core, voltage source means coupled between said measuring electrode means and said collective conductor means at said first end for supplying a voltage therebetween, and means for measuring the electrical conduction characteristic between said electrically separated core in contact with said measuring electrode means at said first end and the remaining cores in contact with said collective conductor means at said first end.

2. The apparatus of claim 1, wherein said holding means comprise two sets of core gripping means adapted to grip said cores and located on both sides of said core pick-up means and spaced apart in the direction of the longitudinal axis of said multi-core cable.

3. The apparatus of claim 2, further comprising means for periodically swinging said core pick-up means in the longitudinal direction of the gripped cores at said one end.

4. The apparatus of claim 1, wherein said core pick-up means comprise movable means having a surface which is movable along said predetermined path of travel, and on which a notch slightly larger than the core diameter is formed, means for driving said movable means, and confining means located adjacent to said movable means for confining a single core in said notch during the movement of said movable means.

5. The apparatus of claim 4, wherein said movable means comprise a rotary disc and said surface comprises a rotative peripheral surface of said rotary disc.

6. The apparatus of claim 5, wherein the thickness of said rotary disc adjacent to said notch is narrower than the other portion thereof.

7. The apparatus of claim 1, wherein said core separating means comprise means for cutting said picked up core and separating it electrically from the remaining cores in contact with said collective conductor means.

8. The apparatus of claim 1, further comprising pick-up detecting means operatively coupled to said core pick-up means and located along said path of travel of said core pick-up means for detecting whether or not a core has been picked up at said first end by said core pick-up means.

9. The apparatus of claim 8, wherein said pick-up detecting means comprise switching means located along said predetermined path of travel of said core pick-up means and adapted to be operable in response to passage of said picked up core past said switching means.

10. The apparatus of claim 8, wherein said pick-up detecting means comprise two pick-up electrode means adapted to be in contact with the conductor of the core picked up by said core pick-up means at two points spaced apart a relatively short distance at said first end of the core, and means coupled to said two electrode means for detecting electrical conduction through the conductor portion of the core between said two electrode means.

11. The apparatus of claim 10, wherein said two pick-up detecting electrode means are located in the vicinity, of said core pick-up means.

12. The apparatus of claim 1, wherein said measuring electrode means comprise a bladed electrode.

13. The apparatus of claim 1, wherein said collective conductor means comprise means for containing an electrically conductive fluid for immersing the cores at said first end.

14. The apparatus of claim 1, wherein said electric conduction characteristic is related to a charging current flowing through the conductor of said core which is separated and is charged with electricity by said voltage source means.

15. The apparatus of claim 1, further comprising pick-up detecting means which include said collective conductor means and core cutting means forming at least two pick-up detecting electrode means, said pick-up detecting means further comprising voltage source means coupled between said two pick-up detecting electrode means, whereby a current flowing between said two pick-up detecting electrode means through the conductor of said picked up core prior to the cutting of the picked up core by said core cutting means, is used as a pick-up detection signal.

16. The apparatus of claim 7, further comprising means for transferring said picked up core along said predetermined path of travel.

17. The apparatus of claim 16, wherein said transfer means comprise elastic movable means having a surface which is movable along said predetermined path of travel, said surface being adapted to be engageable with a picked up core, means for driving said elastic movable means, and means located adjacent said elastic movable means for keeping a picked up core as engaged with said surface of said elastic movable means.

18. The apparatus of claim 17, wherein said elastic movable means comprise an elastic rotary disc, the peripheral surface of which is engageable.

19. A method of electrically testing a multi-core cable terminated at one and the other ends and including a plurality of insulated cores each comprising a conductor wire and an insulation covering said conductor wire, comprising the steps of collectively rendering said plurality of cores conductive at said one end while isolating them from each other at said other end, picking up said cores one by one at said one end by urging said cores at said one end against movable means provided with a notch on its surface, thrusting said cores on a one by one basis into said notch and confining the picked up core in said notch by confining means, electrically separating the core end picked up by said movable means from said means for collectively rendering conductive, charging with electricity said electrically separated picked up core at said one end, and determining on the basis of a change in the electric conduction characteristic of said charged core whether said charged core meets predetermined cable standards.

20. The method of claim 19, wherein said step of electrically separating and said charging step are successively carried out during the movement of said movable means.

21. The method of claim 19, wherein said picking up step comprises swinging said movable means in the longitudinal direction of said cores.

22. The method of claim 19, wherein said electrically separating step comprises cutting said picked up core and electrically separating the picked up core from said collectively rendering conductive step.

23. The method of claim 19, wherein said electric conduction characteristic is related to a charging current through said charged core.

24. The method of claim 19, wherein said picking up step is followed by the additional step of detecting whether or not said picking up step has been carried out.

25. The method of claim 24, wherein said step of detecting the pick-up of the cores comprises the step of detecting a charging current flowing into the portion collectively rendered conductive through said picked up core as a result of said core being charged with electricity.

* * * * *